United States Patent
Deller et al.

(10) Patent No.: US 7,283,934 B2
(45) Date of Patent: Oct. 16, 2007

(54) ACCEPTANCE TESTING OF ACTUATORS USING PREDETERMINED THRESHOLDS

(75) Inventors: Robert W. Deller, Valencia, CA (US); Joon H. Lee, Santa Clarita, CA (US)

(73) Assignee: HR Textron, Inc., Santa Clarita, CA (US)

( * ) Notice: Subject to any disclaimer, the term of this patent is extended or adjusted under 35 U.S.C. 154(b) by 0 days.

(21) Appl. No.: 11/190,303

(22) Filed: Jul. 27, 2005

(65) Prior Publication Data

US 2006/0036402 A1 Feb. 16, 2006

Related U.S. Application Data

(60) Provisional application No. 60/591,836, filed on Jul. 28, 2004.

(51) Int. Cl.
G06F 11/00 (2006.01)
(52) U.S. Cl. ........ 702/183; 702/188
(58) Field of Classification Search ........ None
See application file for complete search history.

(56) References Cited

U.S. PATENT DOCUMENTS

| | | | |
|---|---|---|---|
| 3,229,510 A | 1/1966 | Bodemeijer | 73/761 |
| 5,361,622 A | 11/1994 | Wall | 73/49.2 |
| 5,893,047 A | 4/1999 | Gimblett et al. | 702/33 |
| 6,694,285 B1 * | 2/2004 | Choe et al. | 702/182 |
| 6,944,575 B2 * | 9/2005 | Ueno et al. | 702/188 |
| 7,047,152 B2 * | 5/2006 | Horch | 702/154 |
| 2003/0083794 A1 | 5/2003 | Halm et al. | 701/29 |
| 2004/0230368 A1 * | 11/2004 | Kropinski et al. | 701/114 |
| 2005/0114090 A1 * | 5/2005 | Black et al. | 702/188 |

FOREIGN PATENT DOCUMENTS

EP 0490805 6/1992

OTHER PUBLICATIONS

Byington, C.S., et al, "A model-based approach to prognostics and health management for flight control actuators," *2004 IEEE Aerospace Conference Proceedings*, pp. 3551-3562.

Hadden, G.D., et al., "Shipboard machinery diagnostics and prognostics/condition based maintenance: a progress report," *2000 IEEE Aerospace Conference Proceedings*, pp. 277-292.

Willgoss, R.A., "Mechatronic detection of faults in gearsets using preload and backlash measurements," *Proceedings of International symposium on automotive technology and automation* (1997), pp. 351-356.

PCT International Search Report, mailed Nov. 30, 2005.

Written Opinion of the International Searching Authority, mailed Nov. 30, 2005.

* cited by examiner

*Primary Examiner*—Bryan Bui
*Assistant Examiner*—Jonathan Moffat
(74) *Attorney, Agent, or Firm*—BainwoodHuang

(57) ABSTRACT

An improved technique of acceptance testing an actuator system involves measuring system parameters of the actuator system during operation of the actuator system, and storing the measured system parameters in computerized memory as a set of measured system parameters. The technique further involves obtaining a set of predetermined thresholds. Each predetermined threshold corresponds to a particular measured system parameter. The technique further involves electronically indicating whether the actuator system is in acceptable condition based on an electronic comparison of the set of measured system parameters stored in the computerized memory and the set of predetermined thresholds, e.g., providing a warning of a need for service or of imminent failure when one or more of the system parameters exceeds a corresponding threshold.

20 Claims, 5 Drawing Sheets

ACCEPTANCE TESTING OF ACTUATORS USING PREDETERMINED THRESHOLDS

CROSS REFERENCE TO RELATED APPLICATIONS

This application claims the benefit of U.S. application Ser. No. 60/591,836, filed Jul. 28, 2004, entitled, "ACCEPTANCE TESTING OF FLIGHT CONTROL ACTUATORS", the contents and teachings of which are hereby incorporated by reference in their entirety. This application further relates to U.S. application Ser. No. 11/190,667 filed on even date herewith, entitled "IMPROVED ACCEPTANCE TESTING OF ACTUATORS USING BACKLASH AND STICTION MEASUREMENTS", the contents and teachings of which are hereby incorporated by reference in their entirety.

BACKGROUND

In general, actuators are devices that convert one form of applied power to a usable form of power that often provides motion of an output element. Various types of actuators may be used in many different types of applications and may include hydraulic, pneumatic, and electro-mechanical actuators (EMAs). An EMA is one type of actuator that includes an electric motor and one or more drive train components to transfer and/or convert power provided by the electric motor to an output element.

EMAs and other types of actuators have a finite service life, which typically ends with the complete failure of the actuator or a partial failure of the actuator that is cost-prohibitive to repair. In some applications, the failure of an actuator during operation may not be catastrophic. For other applications, however, it may be highly undesirable or catastrophic for an actuator to fail while it is being used. In aerospace applications, for example, the sudden or catastrophic failure of a flight control actuator system may have life-threatening results.

Certain conventional approaches have been developed for predicting the remaining service life or imminent failure of an actuator system. These conventional approaches typically involve measuring the elapsed time of operation for a particular actuator in its operating environment. When used in certain applications, for example in industrial applications in which the load conditions for the motor are substantially fixed and occur in substantially uniform intervals or time periods, the elapsed time of operation can be a relevant indicator of the remaining service life and service needs for the actuator system.

SUMMARY

Unfortunately, conventional elapsed time approaches do not accurately predict actuator failure or the need for service for applications where the loading conditions are highly variable and/or intermittent in nature. For example, actuators that are used as flight control actuators in aircraft can experience a loading environment that is highly variable and the time intervals between uses may vary greatly. Various factors may include the length and type of flight mission. The most common way of dealing with the uncertainty of the service life of a flight control actuator is by routinely scheduled maintenance checks. These maintenance checks, however, can be very expensive both in terms of down time for the aircraft and in terms of financial expense of the testing/servicing itself.

It can be seen therefore that a need exists for improved techniques for testing actuators, e.g., systems and methods that more accurately determine the remaining service life and/or impending need for service/repair for actuator systems, including EMAs used in aerospace applications.

Aspects of the present invention are directed to systems, methods, and computer-readable media for measuring-wear and load parameters of an actuator, e.g., an EMA, in its working environment. Because the actual total service life of an actuator system may be primarily determined by the load environment to which it has been exposed, such parameters better relate to the remaining service life of the actuator than measuring only the elapsed time of operation of the actuator. By integrating certain of the operational parameters over finite ranges, e.g., of the stroke of the actuator, undesirable loading exposures can be identified. An electronic controller can annunciate near end of life when the system parameters or the integrated values exceed preset statistical limits ("thresholds") that are associated with the specific mechanical design and application of the actuator system.

One embodiment of the invention is directed to a technique of acceptance testing an actuator system which involves measuring system parameters of the actuator system during operation of the actuator system, and storing the measured system parameters in computerized memory as a set of measured system parameters. The technique further involves obtaining a set of predetermined thresholds. Each predetermined threshold corresponds to a particular measured system parameter. The technique further involves electronically indicating whether the actuator system is in acceptable condition based on an electronic comparison of the set of measured system parameters stored in the computerized memory and the set of predetermined thresholds (e.g., providing a warning of a need for service or of imminent failure when one or more of the system parameters exceeds a corresponding threshold).

In some embodiments, obtaining the set of predetermined thresholds includes defining, as at least a portion of the set of predetermined thresholds, a set of threshold values based on a database of experience formed from periodically measured and saved system parameters of the actuator system which were accumulated during operation of the actuator system within an aircraft working environment. Such embodiments enable accurate acceptance testing of the actuator system while the actuator system remains installed thus avoiding possible erroneous removal of good equipment.

BRIEF DESCRIPTION OF THE DRAWINGS

The foregoing and other objects, features and advantages of various embodiments of the invention will be apparent from the following description of these embodiments, as illustrated in the accompanying drawings in which like reference characters refer to the same parts throughout the different views. The drawings are not necessarily to scale, emphasis instead being placed upon illustrating the principles of these embodiments.

DETAILED DESCRIPTION

Figure 1:
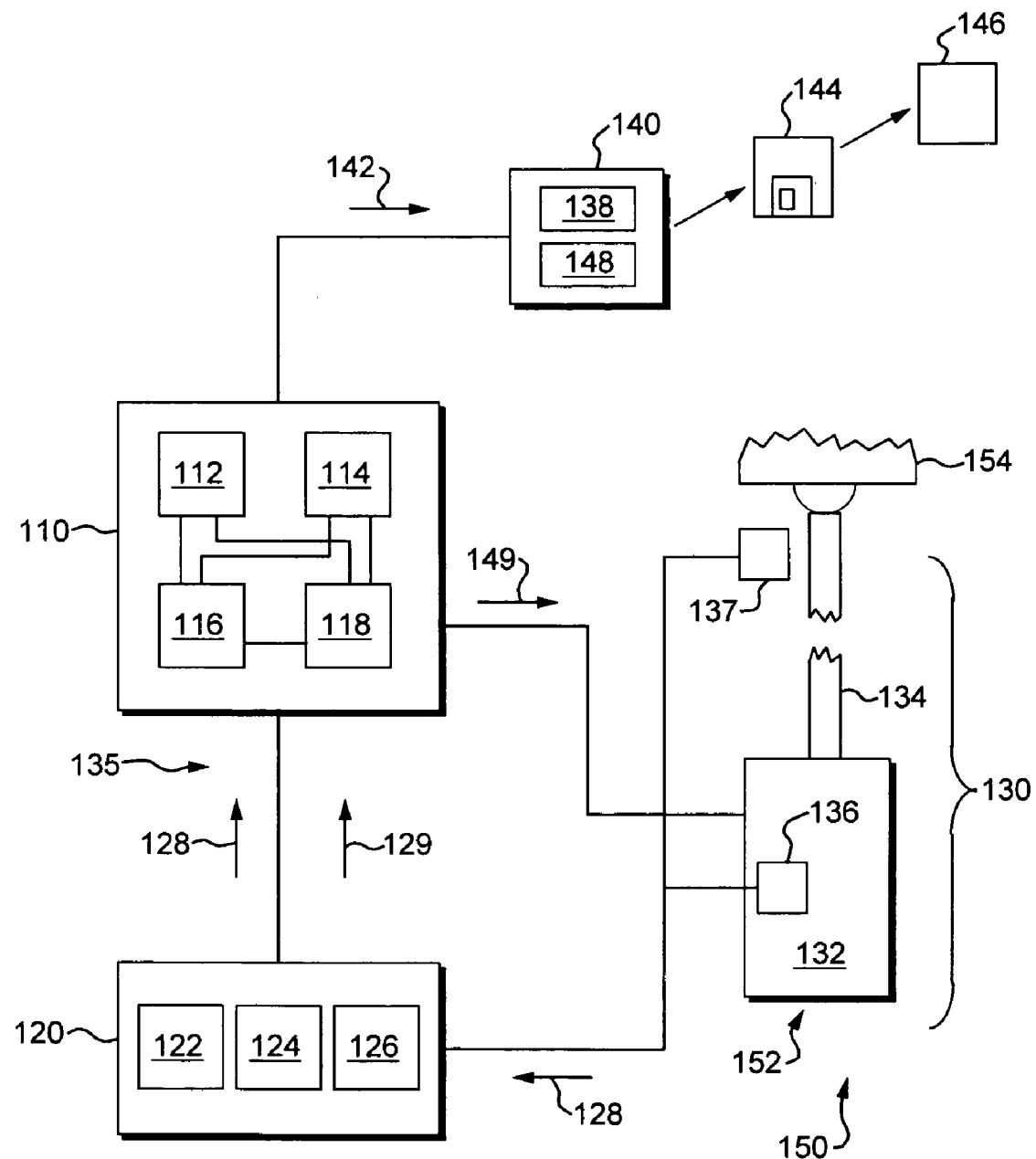
FIG. 1 is a component diagram of a representative system for predicting actuator system failure by measuring and processing system parameters, in accordance with an embodiment of the present invention.

Various embodiments of the present invention may be understood by the following detailed description, which should be read in conjunction with the attached drawings. The following detailed description of certain embodiments is by way of example only and is not meant to limit the scope of the present invention.

Aspects of certain embodiments are directed to systems, methods, and computer-readable media (among other things) for predicting the remaining service life of an actuator system and/or the imminent need for servicing or repair. The actuator system can be installed in an operational or working environment, such as onboard an aircraft. The actuator may be of any suitable type, such as an EMA, a hydraulic actuator, or a pneumatic actuator. By measuring selected actuator system parameters, the health or condition of the actuator system can be monitored and assessed during its operation. These selected actuator system parameters can be stored up to and including the time of failure as a historical record. The historical record of the selected actuator system parameters can be statistically analyzed to derive various thresholds for each of the selected actuator system parameters. Once computed, the thresholds may be used by a controller to monitor the selected actuator system parameters or another similar, actuator system. The controller can compare the measured actuator system parameters to the previously determined threshold values and use the differences to predict the remaining operational time before the failure or the need for service for the actuator system being monitored.

By measuring actuator system parameters that are indicative of wear and load, and not just of the time of operation as in conventional approaches, the current techniques provide improved prediction of when an actuator system will fail or be in need of preventive maintenance. Monitoring one or more system parameters over finite ranges of operational conditions (e.g., the stroke or motion of the actuator output element, a period of time, or a temperature range, etc.) can facilitate identifying undesirable loading exposures. Based on the monitored system parameters, an electronic controller can mathematically integrate the various measurements of the system parameters and trigger an alarm to indicate imminent system failure when the integrated values of the system parameters in any sub-range exceeds the predetermined threshold that is associated with the specific mechanical design and application of the actuator system.

Selected actuator system parameters that may be measured may include any one or any combination of the following parameters: controller temperature, motor temperature, position of the actuator output element, load on the output element, load on the motor, work performed by the motor, the number of illegal Hall state errors, and watchdog events. In addition to these, the total actuation system time of operation may be a measured system parameter. These system parameters may be measured for any type of actuators system, e.g., pneumatic actuators, hydraulic actuators, and/or EMAs.

For some embodiments including an EMA, certain actuator system parameters when capitalized herein are given the following definitions: "Total Actuation System Time" means the accumulated time that an actuator is turned on. "Total Flight Time" means the accumulated time that a controller is turned on, whether the associated actuator(s) is/are enabled on or not. "Average Actuator Position" means an actuator position averaged from all the positions that a specified actuator has been driven to during its normal operation time. "Illegal State Errors" means the total error count of illegal motor Hall sensor states. A Hall state is considered to be "illegal" if all of the signal lines reporting position (typically three) are the same output level or if a state is skipped in the normal clockwise (CW) or counter-clockwise (CCW) sequence. "Watchdog Events" refers to occurrences of watchdog reset. A "watchdog" is a software-implemented timer in the controller that continuously monitors software and hardware operations, and asserts a system reset if software or hardware disruption occurs. "Algorithm Frame" means a cyclic frame for a specified algorithm to complete one loop of its repetitive cycles. The preceding system parameters are exemplary ones, and other system parameters may also be utilized.

Profiles of one or more selected actuator system parameters can be calculated to determine peak or other undesirable operational conditions. The profiles may be over the range of motion of an actuator output element, over a range of temperatures, over a predetermined period of time, or other desired parameter range. Certain profiles described herein are given the following definitions: "Controller Temperature Profile" means a profile of the time that a controller has spent in each of a number of discrete temperature ranges between minimum and the maximum temperatures. "Motor Temperature Profile" means a profile of the time that a motor has spent in each of a number of discrete temperature ranges between minimum and the maximum temperatures. "Position/Time Profile" means a profile of the time that an actuator output element has spent in each of a number of discrete position ranges between. "Distance by Position Profile" means a profile that tracks the total distance traveled by an actuator output element within each of a discrete number of position ranges. "Load by Position Profile" means a profile of the time integral of actuator load, within each of a discrete number of position ranges. "Work by Position Profile" means a profile of the time integral of the total actuator work within each of a discrete number of position ranges. "Peak Load by Position Profile" means a profile that tracks the peak actuator load within each of a discrete number of position ranges. "Peak Work by Position Profile" means a profile that tracks the peak actuator work within each of a discrete number of position ranges. "Peak State/Potentiometer Error by Position Profile" means a profile that tracks the peak error between the position reported by Hall state counting and the position reported by an output potentiometer, within each of a discrete number of position ranges. Other suitable profiles may be used as well.

Some embodiments are direct to computer program products which include computer-readable and computer-executable instructions, such as program modules, which are configured for execution by one or more computers, processors, or other devices capable of performing the necessary operations. Program modules may include routines, programs, objects, components, data structures, and the like that perform particular tasks or implement particular abstract data types. The functionality of the program modules may be combined or distributed as desired in various embodiments. Program modules may be included in firmware, which is software that is embedded in a hardware device that allows reading and executing the software, but does not typically allow modification, e.g., writing or deleting data by an end user. An example of firmware is a computer program in a read-only memory (ROM) integrated circuit chip. Another example of firmware is a program embedded in an erasable programmable read-only memory (EPROM) chip, which program may be modified by special external hardware, but not by an application program.

Computer readable media may comprise computer storage media. Computer storage media may include volatile and non-volatile, removable and non-removable media implemented in any method or technology for storage of information such as computer readable instructions, data structures, program modules, or other data. For example, computer storage media can include, but is not limited to, RAM, ROM, EPROM (flash) memory, CD-ROM, digital versatile disks (DVD), magnetic cassettes, magnetic tape, magnetic disk storage, or the like. Computer readable media may further include communication media that include computer-readable instructions, including data structures, program modules, or other data in a modulated data signal. The term "modulated data signal" means a signal that has one or more of its characteristics set or changed in such a manner as to encode information in the signal. Communication media may include wired media such as a wired network or direct-wired connection, and wireless media such as acoustic, radio frequency (RF), optical (e.g., infrared), and other wireless media.

FIG. 1 depicts representative functional components of a system 100 for predicting actuating system failure by measuring selected actuator system parameters. The system 100 includes an electronic controller 110, means for data acquisition ("DAQ means") 120, an actuator system 130, and a communications medium 135. Signals from the actuator system 130 are received by the DAQ means 120, and then processed by the controller 110. The controller 110 may send the signals to a database 140 for statistical analysis, as needed. Such communications take place through the communications medium 135.

The controller 110 may include the following functional components: non-volatile memory 112 for saving running data and historical data without the need for a constant power supply; random access memory (RAM) 114 for program execution and temporary storage; a processing core 116 that operates at a fixed computational frame rate; and, input/output (I/O) means 118 for downloading and transferring stored data. It will be understood, that although the functional components of the controller 110 are depicted in FIG. 1 as being co-located within an individual controller 110, this is not a requirement. In some embodiments, these functional components may be distributed at different locations and connected appropriately. The I/O means 118, for example, may be co-located within the DAQ means 120.

The DAQ means 120 may include a set of counters 122 (i.e., one or more counters 122), a set of integrators 124 (i.e., one or more integrators 124), and a set of peak detectors 126 (i.e., one or more peak detectors 126). The set of counters 122 is configured to count events such as the total elapsed time or the number of times that illegal Hall states are detected. The set of integrators 124 is configured to collect data as a cumulative sum of a measured system parameter multiplied by a time interval across which the measured parameter is assumed to be constant. The integrators 124 keep a record of the total cumulative exposure to the measured parameter(s). The set of peak detectors 126 is configured to keep track of the greatest value or magnitude of a detected system parameter experienced by the actuator system 130 since the time of initialization of the detector(s) 126. Signals 128 from the sensors of the actuator system 130 are received by the DAQ means 120 which is in turn accessible by the controller 110. Signals 129 from the set of counters 122, the set of integrators 124 and the set of peak detectors 126 are also accessible by the controller 110.

The actuator system 130 is shown by way of example as an EMA which includes a motor 132, an output element 134, and various sensors as indicated by 136-137. The sensors 136-137 function to report or measure data corresponding to operation of the system 100 such as position of the actuator output element 134, load on the EMA motor 132, etc. Any suitable type and number of sensors 136-137 may be used. Examples of suitable sensors 136-137 include, but are not limited to, position transducers, temperature sensors, timers, current sensors, voltage sensors, Hall sensors, and the like. Suitable position transducers may include variable displacement transformers of the rotary (RVDT) and/or linear (LVDT) types. The signals 128 produced by the sensors 136-137 are received by the DAQ means 120 and then the input/output (I/O) means 118 of the controller 110. The controller 110 may receive the signals 128, 129 through the I/O means 118 and process system parameters 138 defined by these signals 128, 129. The controller 110 may further send signals 142 defining these system parameters 138 to a suitable database 140 for evaluation.

The system parameters 138 may be subsequently stored on some form of computer readable media 144 that is accessible by another device 146 (e.g., a computer, microprocessor, or the like). The device 146 may operate to find trends or statistical limits for each system parameter 138, and may be implemented in any suitable hardware or software. Thresholds 148 which are subsequently computed using the system parameters 138 can be transferred to the database 140 and implemented in the controller 110 or another desired controller.

The controller 110 is configured and arranged to (i) control the operation of the actuator system 130 using control signals 149, and (ii) acceptance test the actuator system 130. The controller 110 may be configured to operate at a desired computational frame rate that is sufficiently fast to meet the dynamic performance requirements for the system 100. The frame rate, in certain embodiments, is a fixed rate of 1 KHz. The period corresponding to the frame rate may be controlled for high regularity, for example by a timing crystal. A high degree of regularity may be desirable for implementation of corresponding methods and/or algorithms, e.g., the MBIT algorithm described herein. If the processing core 116 of the controller 110 has enough throughput, algorithms may be run at the same frame rate that the actuator system control laws are executed. Slower frame rates are acceptable for the controller 110, but preferably the frame rate is at least five (5) times the actuator bandwidth. The controller 110 may implement the thresholds 148 and subsequently computed system parameters 138.

The non-volatile memory 112 can be used for saving system parameter values 138 stored in the DAQ means 120 when power is removed from the controller 110. Those parameter values 138 can be restored for continued data collection when the control unit 110 is powered up again. This allows the stored system parameters 138 to reflect the entire life of the actuator system 130. The non-volatile memory 112 may also be used to periodically save a "snapshot" of the parameters so that the rates of change of the parameter values can also be evaluated.

The non-volatile 112 may include "Flash" memory chips, which are electrically erasable, programmable, read-only memory (EEPROM) chips that can be erased and reprogrammed in blocks instead of only one byte at a time. In certain applications, other suitable types of non-volatile memory 112 may be used. Any suitable size or capacity of the non-volatile memory 112 may be used. Various factors including data resolution, the number of position ranges that the integrators 124 are divided into, and the number of periodic data saves that are desired may influence capacity of the non-volatile memory 112. An example of suitable memory capacity for the non-volatile memory 112 and corresponding memory allocation for system parameters for one application are described as follows in TABLE 1:

TABLE 1

| Parameter | Resolution | Ranges | No. Records | Total [bytes] |
|---|---|---|---|---|
| Total Actuation System Time | 4 | 1 | 50 | 200 |
| Total Flight Time | 4 | 1 | 50 | 200 |
| Controller Temperature Profile | 4 | 20 | 50 | 4000 |
| Motor Temperature Profile | 4 | 20 | 50 | 4000 |
| Average Actuator Position | 4 | 1 | 50 | 200 |
| Position/Time Profile | 4 | 20 | 50 | 4000 |
| Distance by Position Profile | 4 | 20 | 50 | 4000 |
| Load by Position Profile | 4 | 20 | 50 | 4000 |
| Work by Position Profile | 4 | 20 | 50 | 4000 |
| Peak Load by Position Profile | 4 | 20 | 50 | 4000 |
| Peak Work by Position Profile | 4 | 20 | 50 | 4000 |
| Peak State/Pot Error by Position | 4 | 20 | 50 | 4000 |
| Illegal State Errors | 4 | 1 | 50 | 200 |
| Watchdog Events | 4 | 1 | 50 | 200 |
| Total: | | | | 37000 |

It will be understood that the allocation of memory space indicated in TABLE 1 is one example. Any suitable memory allocation may be used.

It should be understood that the above-described system 100 is particularly well-suited for use as an acceptance testing system in an aircraft working environment 150. In such a working environment 150, the actuator system 130 resides in a fixed location 152 (e.g., a mounting portion of an aircraft) and is configured to move a load 154 relative to the fixed location 152 in response to the control signals 149 from the controller 110. The system 100 is also well-suited for similar loading environments where loading is highly variable and/or where the time intervals between uses varies greatly.

Figure 2A:
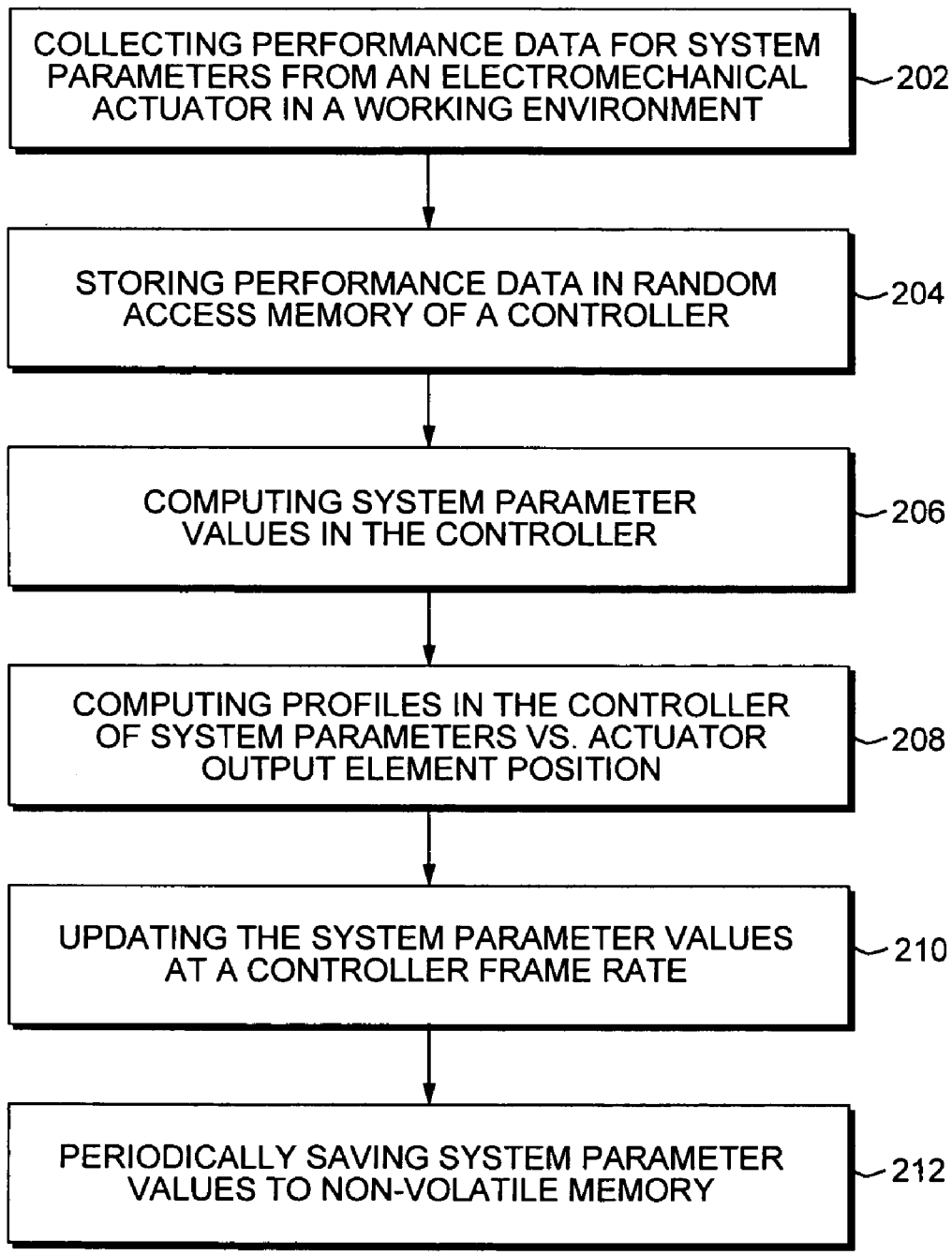
FIGS. 2A and 2B show a flowchart of a procedure for predicting actuator system failure by measuring and processing actuator system parameters, in accordance with a further embodiment of the present invention.
Figure 2B:
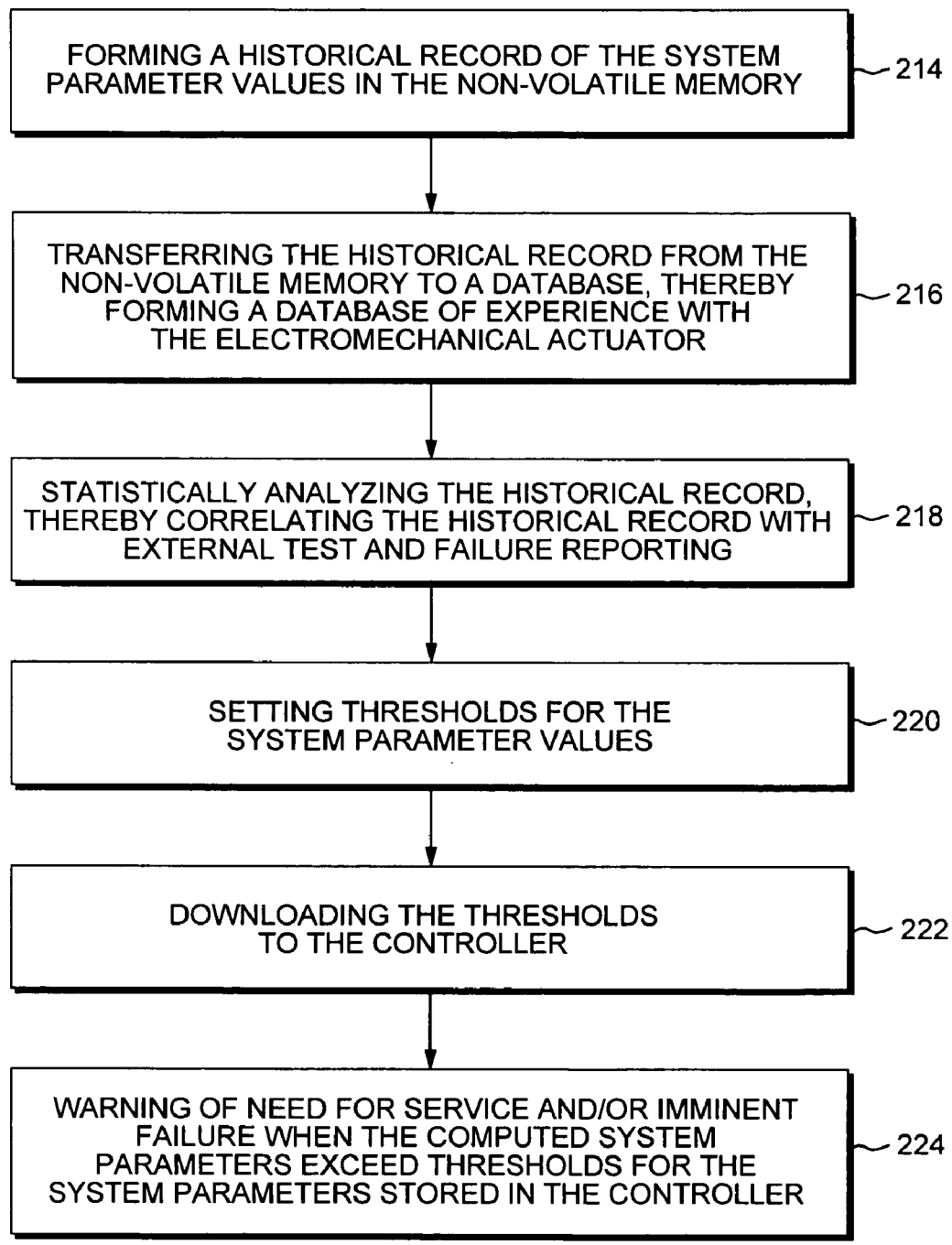

FIGS. 2A and 2B show a procedure 200 for predicting actuator system failure by measuring system parameters 138 in the context of an aircraft working environment. Suitable sensors and control system data acquisition circuitry (e.g., the sensors 136-137 and the DAQ 120 means, see FIG. 1) operate to collect for the selected actuator system parameter data from an actuator system 130 in its working environment (e.g., an aircraft working environment), as described at step 202. In certain embodiments, the actuator system 130 may include an EMA (also see FIG. 1). The DAQ means 120 can receive data from any number of suitable sensors 136-137 each of which are configured and arranged to detect or sense one or more of the selected actuator system parameter data of the actuator system 130. For example, the following state data may be taken from the DAQ means 120 and appropriately scaled: an indication of weight on wheels; controller temperature; motor temperature; motor position, for example as given in Hall state counts; output position, typically a potentiometer or LVDT signal scaled to match motor position; motor current; illegal Hall state flag; and watchdog events flag. The performance data is stored non-volatile memory of a controller, as described at step 204. Actuator system parameter values are computed in the controller 110, as described at step 206.

Examples of selected actuator system parameter data that may be collected and of the computations that may be performed using the collected data of the selected actuator system parameters at step 206 may include Total Actuation System Time, Total Flight Time, Controller Temperature Profile, Motor Temperature Profile, Average Actuator Position, Position/Time Profile, Distance by Position Profile, Load by Position Profile, Work by Position Profile, Peak Load by Position Profile, Peak Work by Position Profile, Peak State/Potentiometer Error by Position, Illegal State Errors, and Watchdog Events. The preceding are only meant to be exemplary in nature, and other system parameter data and other calculations may also be utilized.

Profiles of certain of the tracked system parameters may be computed over the range of motion of the actuator output element 134, as described at step 208. Additional information may be gained by breaking the tracked parameters into ranges of actuator position where the load and work exposure occurs. For example, if the load is concentrated in a very narrow range of positions, wear is much more likely there. High loading in a limited portion of the actuator range of motion could indicate that the actuator service life could be improved by redistribution of the load across the stroke of the output. Profiles of system parameters may be calculated over other types of ranges, for example, time or temperature. The actuator system parameter values may be periodically updated at the operational frame rate of the controller, as described at step 210. The actuator system parameter values may be periodically saved to non-volatile memory 112 (FIG. 1), as described at step 212.

Continuing with the description of method 200 as shown in FIG. 2B, a historical record of the system parameter values can be formed in the non-volatile memory 112, as described at step 214. The collected data of the historical record can be downloaded into the database 140, as described at step 216. Once in the database 140, the historical record (e.g., also see the system parameters 138 in FIG. 1) may be statistically analyzed to correlate the historical record with external test and failure data, as described at step 218. Based on this analysis, thresholds 148 may be set for testing when the EMA of the actuator system 130 should be removed or repaired, as described at step 220 and as described in greater detail for FIG. 3. As the database becomes statistically significant, those thresholds 148 can be put back into the database 140 and then conveyed into the non-volatile memory 112 of the controller 110 (or downloaded directly into the non-volatile memory 112 of the controller 110), as described at step 222. When the subsequently measured and computed system parameters 138 exceed the thresholds 148 for such system parameters 138 that are stored in the controller 110, a warning indicating imminent failure and/or need for service may be announced or issued, as described at step 224.

In certain embodiments, the step of computing actuator system parameter values, described at step 206, may include transferring data to RAM 114 of the controller 110. On power up of the controller 110, for example, data in a buffer of the non-volatile memory 112 may be retrieved and stored in system RAM 114 for accumulation at the frame rate of the controller 110. As a further example, data in the DAQ means 110 (e.g., counters 122, integrators 124 and peak detectors 126) may be transferred from non-volatile memory 112 to RAM 114 byte for byte at the stored resolution.

The integrator values from the DAQ means 120 may be padded in the non-volatile memory 112 with two or more least significant bytes in order to maintain the necessary resolution without overwhelming the non-volatile memory requirement. TABLE 2 indicates how the data may be moved from non-volatile memory 112 to RAM 114 on power up and back out to non-volatile memory 112 on power down or on a timed interval.

TABLE 2

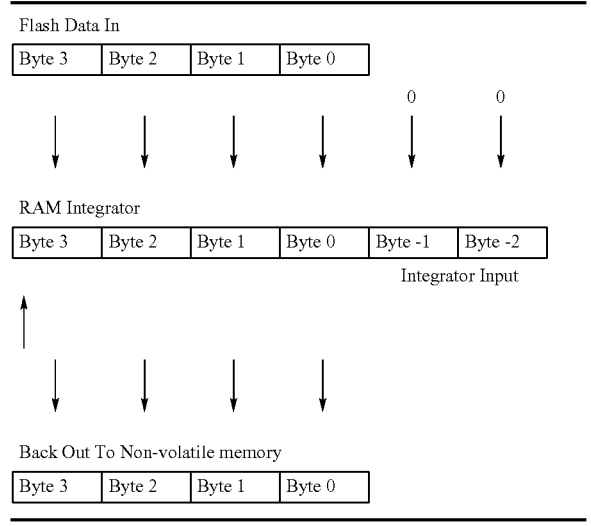

While a suitable controller 110 is running the algorithm, a copy of the counters 122, integrators 124, and peak detectors 126 of the DAQ means 120 can be written to a non-volatile memory buffer at a periodic interval, as described at step 212. Any suitable length may be selected for the interval, e.g., every five minutes. If enough warning time exists prior to a controller shutdown, the data can be written at that time also.

At a larger time interval, e.g., once every 50 hours of Total Actuation System Time, a copy of the non-volatile memory buffer may be made and saved to an additional indexed portion of non-volatile memory, as described at step 212. If the non-volatile memory space becomes full, previously filled memory locations can be re-written using the following guidelines: saving the first two records (the first and second set ever taken); saving the most recent four records; saving at least one adjacent pair of records near the midpoint in hours between the oldest and the most recent records. For these save procedures, the order of the records may vary since they can be indexed and sorted at any time by the Total Actuation System Time system parameter.

Figure 3A:
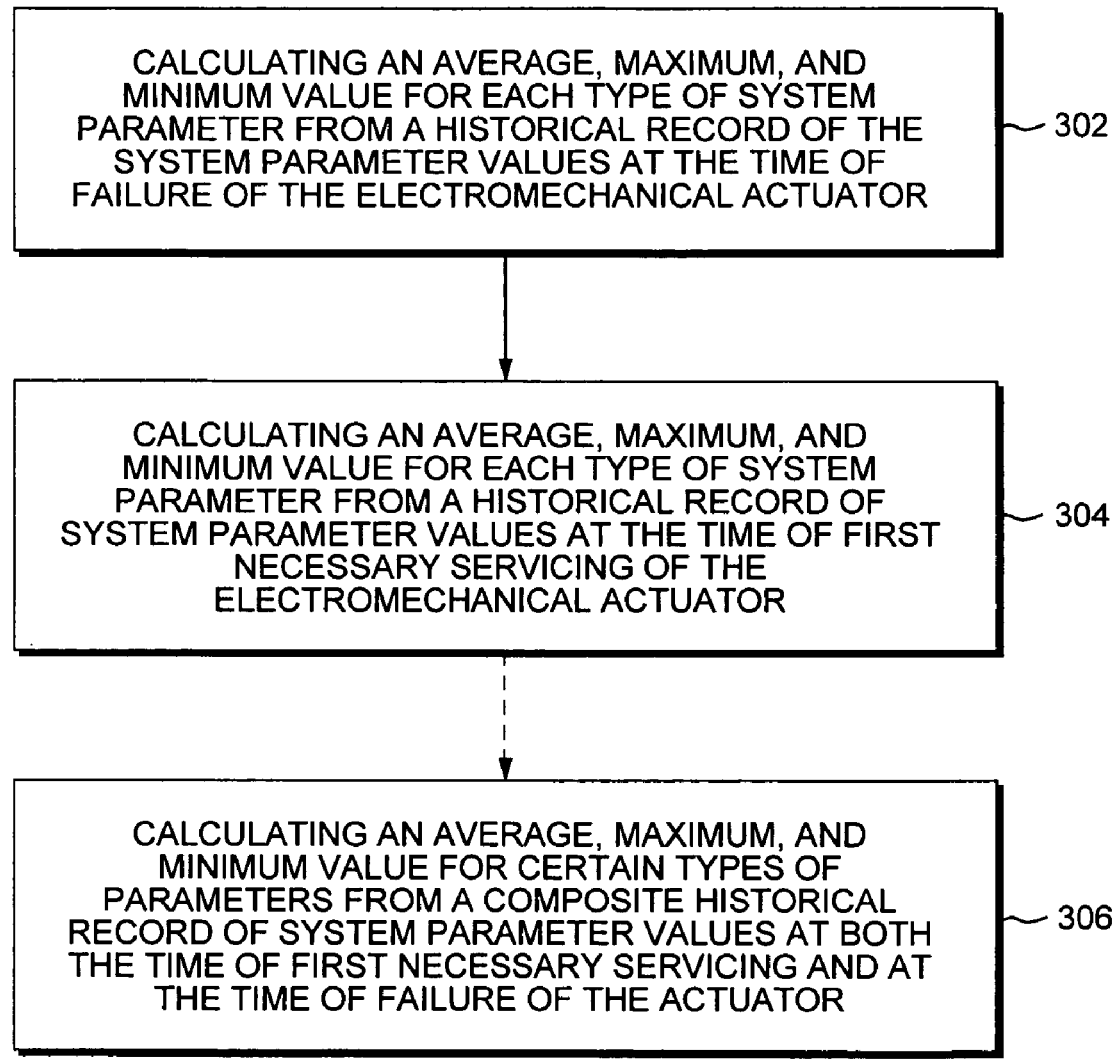
FIGS. 3A and 3B show a flowchart of a procedure for statistically analyzing actuator performance data, in accordance with a further embodiment of the present invention.
Figure 3B:
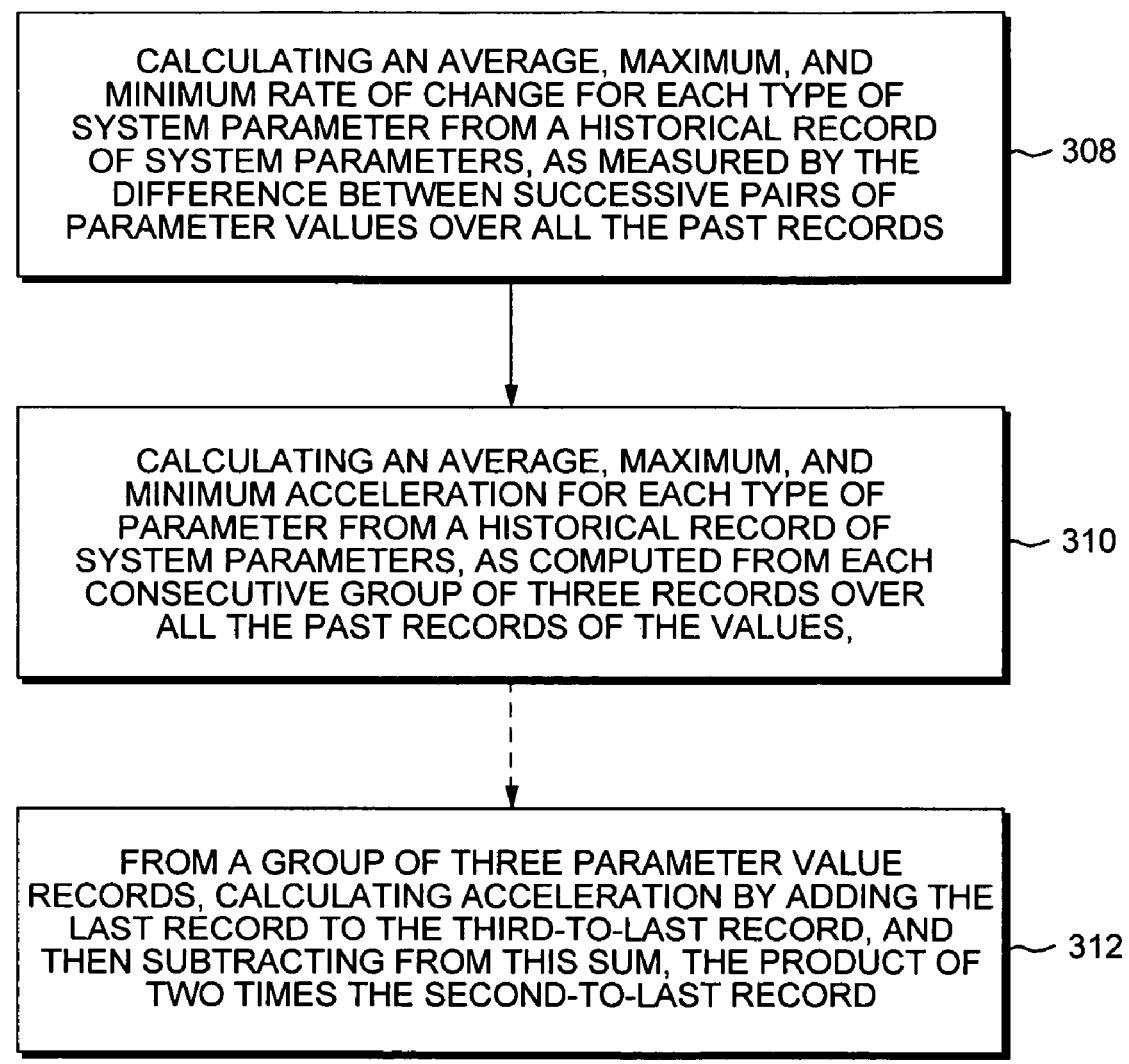

FIGS. 3A and 3B show a procedure 300 for obtaining statistical thresholds 148 for desired actuator system parameters 138. Before performance data and computed system parameter values are used to assess actuator health and remaining life, a statistical basis for the actuator design (e.g., an EMA system) and the above-listed parameter values may be established. To accomplish this, a database of experience with the same or similar actuator system is created. The history is correlated with external test and failure reporting for the actuator system design or similar such designs. For this, certain statistics are computed or created from the history of parameter values for a particular actuator system design. The procedure 300 may be implemented as desired, for example, as part of step 208 of the procedure 200 described for FIG. 2.

Referring to FIG. 3A, an average, maximum, and minimum values may be calculated, as described at step 302, for each type of system parameter 138 that is saved in a historical record of the system parameter values at the time of the failure of an EMA of a particular design. The time of failure, or "end of life," of an EMA may be defined as any one of the following: failure of an actuator system component in its installed environment or when installed on a test stand; failure of the actuator system 130 to meet minimum acceptance test criteria (ACT); intermittent, erratic, or rough operation; or, any obvious sign of an impending failure.

The average, minimum, and maximum values of each parameter at the time of the first necessary servicing of the actuator system may be calculated, as described at step 304, where servicing is defined as anyone of the following: need for cleaning and or lubrication; replacement of any parts including seals or gaskets; or, need for any kind of adjustments or calibration.

Average, minimum, and maximum values may be calculated, as described at step 306, for a composite parameter of all of the ranges of given measurement type combined at the time of first servicing and at the time of failure. Composite parameters may, for example, be calculated for the following parameters: Distance by Position Profile; Load by Position Profile; Work by Position Profile; Peak Load by Position Profile; Peak Work by Position Profile; and Peak State/Potentiometer Error by Position Continuing with the description of the procedure 300 as shown in FIG. 3B, average, minimum, and maximum rates of change may be calculated, as described at step 308, for each type of parameter from a historical record of the system parameters 138. The rates of change may be measured by the difference between successive pairs of values for that type of parameter over all the records of that parameter in the historical record.

Average, minimum, and maximum acceleration values for each parameter may be calculated, as described at step 310. An acceleration values may be calculated, as described at step 312, from groups of three consecutive parameter records of each type of parameter by adding the last record to the third-to-last record, and then subtracting from the sum the product of two times the second-to-last record.

In some embodiments, a suitable controller 110 executes the following subroutines as part of a maintenance built-in test (MBIT) algorithm for measuring system parameters and predicting failure of an EMA system:

MBIT Algorithm

Subroutine 1—Total Actuation System Time:

```
TT Second Counter = TT Second Counter + 1
If ( TT Second Counter >= Frames / Second ) Then:
    TT Second Counter = 0
    Total Actuation System Time = Total Actuation System Time + 1
```

Subroutine 1 operates to update a time counter based on an conditional if-statement that checks to see if the counter is greater than or equal to a variable for frames divided by seconds, thereby monitoring the accumulated time that the EMAs are turned on.

Subroutine 2—Total Flight Time Sub-routine:

```
If ( Weight on Wheels = True ) Then:
    FT Second Counter = FT Second Counter + 1
```

-continued

```
If ( FT Second Counter >= Frames / Second ) Then:
    FT Second Counter = 0
    Total Controller Time = Total Controller Time + 1
```

Subroutine 2 operates to update a variable that corresponds to a system parameter for the accumulated time that the controller of the control actuation systems is turned on whether the actuators are enabled or not.

Subroutine 3—Controller Temperature Profile:

For Subroutine 3, an array is defined, e.g., Array CTcount (20), as a counter for 20 temperature ranges. A temperature range is then defined as the index and initialized to zero, e.g., TR=0. The following conditional statements are then followed:

```
If ( Controller Temp < -40° F ) Then TR = 0
If ( Controller Temp >= -20° F AND Controller Temp < 0° F ) Then
    TR = 1
If ( Controller Temp >= 0° F AND Controller Temp < 20° F ) Then
    TR = 2
    ----- and so on -----
If ( Controller Temp >= 320° F AND Controller Temp < 340° F )Then
    TR = 18
If ( Controller Temp >= 340° F ) Then TR = 19
CTcount ( TR ) = CTcount ( TR ) + 1
If ( CTcount ( TR ) >= Frames / Second ) Then:
    Controller Temperature ( TR ) = Controller Temperature ( TR ) + 1
    CTcount ( TR ) = 0
```

Subroutine 3 operates to update a counter for a controller temperature system parameter when the controller is operating. Subroutine 3 may, in certain embodiments, be used for calculating a profile or curve of the amount of time that the controller has spent in each of a number of discrete temperature ranges between the minimum and maximum temperatures.

Subroutine 4—Motor Temperature Profile:

An array is defined, e.g., Array MTcount (20), as a counter for 20 temperature ranges. A temperature range is then defined as an index and initialized to zero, e.g., TR=0. The following conditional statements are then followed:

```
If ( Motor Temp < -40° F ) Then TR = 0
If ( Motor Temp >= -20° F AND Motor Temp < 0° F ) Then TR = 1
If ( Motor Temp >= 0° F AND Motor Temp < 20° F ) Then TR = 2
    ----- and so on -----
If ( Motor Temp >= 320° F AND Motor Temp < 340° F )Then TR = 18
If ( Motor Temp >= 340° F ) Then TR = 19
MTcount ( TR ) = MTcount ( TR ) + 1
If ( MTcount ( TR ) >= Frames / Second ) Then:
    Motor Temperature (TR ) = Motor Temperature ( TR ) + 1
    MTcount ( TR ) = 0
```

Subroutine 4 operates to update a counter corresponding to a motor temperature system parameter. The subroutine may be used to calculate a profile or curve of the amount of time that a motor has spent in each of a number of discrete temperature ranges between the minimum and maximum temperatures.

Subroutine 5—Average Actuator Position:

Average Actuator Position=Average Actuator Position+Actuator Position

The integrator above may contain the sum of all positions over the life of the actuator.

The following leads to a preferred result:

Average=Average Actuator Position/(Total Actuation System Time*Frames/second)

Subroutine 5 operates to calculate a system parameter of a weighted average of all the positions of the actuator output during the time of operation.

Subroutine 6—Position/Time Profile:

```
Array Pcount ( 20 ) as a counter for 20 position ranges
Define AP as the position range Index
If ( Position < -90% ) Then AP = 0
If ( Position >= -90 AND Position < -80 ) Then AP = 1
If ( Position >= -80 AND Position < -70 ) Then AP = 2
    ----- and so on -----
If ( Position >= -10 AND Position < 0 ) Then AP = 9
If ( Position >= 0 AND Position < 10 ) Then AP = 10
    ----- and so on -----
If ( Position >= 80 AND Position < 90 )Then AP = 18
If ( Position >= 90 ) Then AP = 19
Pcount ( AP ) = Pcount ( AP ) + 1
If ( Pcount ( AP ) >= Frames / Second ) Then:
    Position Time ( AP ) = Position Time ( AP ) + 1
    Pcount ( AP ) = 0
```

Subroutine 6 may be used to calculate a profile or curve of the amount of time that the actuator output position has spent in each of a number of discrete position ranges between+/−100% of stroke.

Subroutine 7—Distance by Position Profile:

Using "AP" from the Position/Time Profile in Subroutine 6, the following conditional statements are performed:

```
If ( AP = APlast ) Then:
    Distance ( AP ) = Distance ( AP ) + Absolute Value ( Position -
        PositionLast )
PositionLast = Position
APlast = AP
```

The data received for the Position, as used in Subroutine 7, are preferably well-filtered to prevent noise from exaggerating the result. Any suitable means for filtering noise, e.g., a circuit or software implementing a Butterworth filter, may be used.

Subroutine 7 may be used to calculate a profile or curve that tracks the total distance traveled by the actuator output element, e.g., rod, whether extending or retracting, within each of a discrete number of position ranges between+/− 100% of stroke.

Subroutine 8—Load by Position Profile:

Using "AP" from the Position/Time Profile in Subroutine 6, the following conditional statements are performed:

```
Load = kl * Absolute Value ( Motor Current )
Load Profile ( AP ) = Load Profile ( AP ) + Load
```

Subroutine 8 may be used to calculate a profile or curve of the time integral of actuator load, within each of a number of position ranges between=/−100% of stroke.

Subroutine 9—Work by Position Profile:

Using "AP" from the Position/Time Profile in Subroutine 6, the following conditional statements are performed:

```
Work = kw * Absolute Value ( Motor Current ) * Absolute Value (
    Position –
    PositionLast )
Work Profile ( AP ) = Work Profile ( AP ) + Work
```

Subroutine 9 may be used to calculate (or determine?) a profile or curve of the time integral of the total actuator work (i.e., load multiplied by the distance traveled by the output element, whether extending or retracting) within each of a discrete number of position ranges between+/−100% of stroke.

Subroutine 10—Peak Load by Position Profile:

Using "AP" from the Position/Time Profile in Subroutine 6, the following conditional statements are performed:

```
Load = kl * Absolute Value ( Motor Current )
If ( Load > Peak Load ( AP ) ) Then Peak Load ( AP ) = Load
```

Subroutine 10 may be used to calculate a profile or curve that tracks the peak actuator load (absolute value) within each of a discrete number of position ranges between+/−100% of stroke.

Subroutine 11—Peak Work by Position Profile:

Using "AP" from the Position/Time Profile in Subroutine 6, the following conditional statements are performed:

```
Work = kw * Absolute Value (Motor Current) * Absolute Value
    (Position – PositionLast)
If (Work > Peak Work(AP)) Then Peak Work (AP) = Work
```

Subroutine 11 may be used to calculate a profile or curve that tracks the peak actuator work (absolute value) within each of a discrete number of position ranges between+/−100% of stroke.

Subroutine 12—Peak State/Potentiometer Error by Position:

Using "AP" from the Position/Time Profile in Subroutine 6, the following conditional statements are performed:

```
PeakStatePot = Absolute Value (Motor Position – Output Position)
If (PeakStatePot > PeakStatePot (AP)) Then PeakStatePot (AP) =
    PeakStatePot
```

Subroutine 12 may be used to calculate a profile or curve that tracks the peak error between the position reported by Hall state counting and the position reported by an output potentiometer, within each of a discrete number of position ranges between +/−100% of stroke.

Subroutine 13—Illegal State Errors:

```
If (Illegal State Flag = True) Then:
    Illegal State Errors = Illegal State Errors + 1
```

Subroutine 13 updates a variable that corresponds to the occurrences of illegal Hall states. For position measurement and/or commutation of a brushless DC motor, an illegal Hall state is one that corresponds to a physically unrealizable state for a given motor and a given number of Hall sensors or if a Hall state is skipped in the normal clockwise (CW) or counter-clockwise (CCW) motion sequence for the motor. For example, for a motor with three Hall position sensors, a Hall state is illegal if all three Hall sensor outputs are the same output level.

Subroutine 14—Watchdog Events:

```
If (Watchdog Flag = True) Then:
    Watchdog Events = Watchdog Events + 1
```

The Watchdog Events sub-routine updates a variable that corresponds to the occurrences of a system parameter for the number of watchdog resets, where a "watchdog" is a software-implemented timer in a controller that continuously monitors software and hardware operations, and which asserts a system reset if a software or hardware disruption occurs.

If the processor implementing the MBIT algorithm has enough throughput, the algorithm is preferably run at the same frame rate that the actuator system control laws are executed. As described above for FIG. 1, slower rates are acceptable but preferably the rate is at least five (5) times the actuator bandwidth.

From the description herein, it will be understood that embodiments of the present invention offer various advantages over conventional approaches. Systems, methods, and computer-readable media according to these embodiments measure actuator system parameters that are indicative of wear and load and that better relate to remaining actuator life than just measuring the elapsed time of operation for a particular actuator in its working environment. Microprocessor functionality and non-volatile memory, e.g., "Flash", can facilitate the prediction of remaining actuator system service life by retaining data about system parameters when power is removed from an associated actuator system. Historical data, including the conditions under which failure occurred, for one actuator system can be used for same actuator system or other identical or similar actuator systems. Thresholds can be determined from statistical analyses of the historical data. The thresholds can be implemented in a desired actuator control and may be reset as desired. Failure and service can be predicted for actuators in applications that otherwise would be hinder servicing or testing.

While certain embodiments have been described others are possible as well. Embodiments may implement an algorithm, for example, having any sub-combination of the Subroutines 2-14 described previously or functionally equivalent subroutines, with or without Subroutine 1, for a method of predicting failure of an EMA system. Methods and algorithms according to these embodiments may be implemented as computer-executable instructions in any suitable computer-readable medium and in any type of suitable hardware. While the previous description of particular embodiments gave examples of an EMA-based actuator system, other types of actuators are suitable for use as well.

Furthermore, it should be understood that the above-described techniques are capable of being combined with other acceptance testing techniques such as techniques which involve measurement and processing of actuator backlash and/or stiction. Examples of such measurement and processing techniques are disclosed in earlier-referenced U.S. application Ser. No. 11/190,667 filed on even date herewith, entitled "IMPROVED ACCEPTANCE TESTING OF ACTUATORS USING BACKLASH AND STICTION MEASUREMENTS", the contents and teachings of which are hereby incorporated by reference in their entirety.

What is claimed is:

1. A test system to acceptance test a first actuator system, the test system comprising:
   a data acquisition circuit configured to interface with the first actuator system;
   a controller including a processing core and computerized memory; and
   a communications medium which connects the data acquisition circuit to the controller,
   wherein the processing core is configured to:
   maintain a database of experience formed from system parameter values of a second actuator system of the same type as the first actuator system, the system parameter values of the second actuator system being obtained during operation of the second actuator system at a time of failure of the second actuator system;
   set thresholds for system parameter values of the first actuator system based on the system parameter values of the second actuator system at the time of failure of the second actuator system;
   measure system parameter values of the first actuator system during operation of the first actuator system and storing the measured system parameter values in computerized memory as a set of measured system parameter values;
   and electronically indicate whether the first actuator system is in acceptable condition based on an electronic comparison between the thresholds and the measured system parameter values stored in the computerized memory.

2. A test system as in claim 1 wherein the processing core, when measuring the system parameters values of the first actuator system during operation of the first actuator system, is configured to:
   direct the data acquisition circuit to receive sensor signals from sensors of the first actuator system, the sensor signals identifying operating conditions of the first actuator system during operation; and
   direct the data acquisition circuit to quantify the operating conditions identified by the sensor signals as at least a portion of the system parameters values of the first actuator system.

3. A test system as in claim 2 wherein the data acquisition circuit includes a set of counters; and wherein the processing core, when directing the data acquisition circuit to quantify the operating conditions identified by the sensor signals, is configured to:
   enable incrementing of the set of counters based on particular operating events identified by the sensor signals to count the particular operating events.

4. A test system as in claim 2 wherein the data acquisition circuit includes a set of integrators; and wherein the processing core, when directing the data acquisition circuit to quantify the operating conditions identified by the sensor signals, is configured to:
   enable collecting, within the set of integrators, cumulative sums of particular operating conditions defined by the sensor signals multiplied by times of exposure to the particular operating conditions to record total cumulative exposure times to the particular operating conditions.

5. A test system as in claim 2 wherein the data acquisition circuit includes a set of peak detectors; and wherein the processing core, when directing the data acquisition circuit to quantify the operating conditions identified by the sensor signals, is configured to:
   enable tracking, within the set of peak detectors, particular operating conditions identified by the sensor signals to determine greatest magnitudes of the particular operating conditions.

6. A test system as in claim 1 wherein the system parameters values of the second actuator system were obtained during operation of the second actuator system within an aircraft working environment and have system parameter types; and wherein the processing core, when setting the thresholds, is configured to:
   calculate an average, a maximum, and a minimum value for each system parameter type, and
   set the thresholds from the average, maximum and minimum values for each system parameter type.

7. A test system as in claim 1 wherein the processing core, when setting the thresholds, is configured to:
   statistically analyze the database of experience to correlate the database of experience with external test and failure data as represented by the system parameter values of the second actuator system at the time of failure of the second actuator system; and
   set the threshold values based on the statistical analysis.

8. A test system as in claim 1 wherein the processing core is further configured to compute profiles of the system parameters values over at least one type of range selected from the group consisting of position, time and temperature.

9. A test system as in claim 8 wherein the processing core, when computing profiles of the system parameters values, is configured to compute profiles of the system parameters values over a range of actuator motion.

10. A test system as in claim 8 wherein the profiles are selected from the group consisting of Total Flight Time, Controller Temperature Profile, Motor Temperature Profile, Average Actuator Position, Position/Time Profile, Distance by Position Profile, Load by Position Profile, Work by Position Profile, Peak Load by Position Profile, Peak Work by Position Profile, Peak Hall State/Potentiometer by Position, Illegal Hall States, and Watchdog Events.

11. A method of acceptance testing a first actuator system, comprising:
   maintaining a database of experience formed from system parameter values of a second actuator system of the same type as the first actuator system, the system parameter values of the second actuator system being obtained during operation of the second actuator system at a time of failure of the second actuator system;
   setting thresholds for system parameter values of the first actuator system based on the system parameter values of the second actuator system at the time of failure of the second actuator system;
   measuring system parameter values of the first actuator system during operation of the first actuator system and storing the measured system parameter values in computerized memory as a set of measured system parameter values;
   and electronically indicating whether the first actuator system is in acceptable condition based on an electronic comparison between the thresholds and the measured system parameter values stored in the computerized memory.

12. A method as in claim 11 wherein measuring the system parameters values of the first actuator system during operation of the first actuator system includes:
    receiving sensor signals within a data acquisition circuit from sensors of the first actuator system, the sensor signals identifying operating conditions of the first actuator system during operation; and
    quantifying, within the data acquisition circuit, the operating conditions identified by the sensor signals as at least a portion of the system parameters values of the first actuator system.

13. A method as in claim 12 wherein the data acquisition circuit includes a set of counters; and wherein quantifying the operating conditions identified by the sensor signals includes:
    incrementing the set of counters based on particular operating events identified by the sensor signals to count the particular operating events.

14. A method as in claim 12 wherein the data acquisition circuit includes a set of integrators; and wherein quantifying the operating conditions identified by the sensor signals includes:
    collecting, within the set of integrators, cumulative sums of particular operating conditions defined by the sensor signals multiplied by times of exposure to the particular operating conditions to record total cumulative exposure times to the particular operating conditions.

15. A method as in claim 12 wherein the data acquisition circuit includes a set of peak detectors; and wherein quantifying the operating conditions identified by the sensor signals includes:
    tracking, within the set of peak detectors, particular operating conditions identified by the sensor signals to determine greatest magnitudes of the particular operating conditions.

16. A method as in claim 11 wherein the system parameters values of the second actuator system were obtained during operation of the second actuator system within an aircraft working environment and have system parameter types; and wherein setting the thresholds includes:
    calculating an average, a maximum, and a minimum value for each system parameter type, and
    setting the thresholds from the average, maximum and minimum values for each system parameter type.

17. A method as in claim 11 wherein defining the set of threshold values includes:
    statistically analyzing the database of experience to correlate the database of experience with external test and failure data as represented by the system parameter values of the second actuator system at the time of failure of the second actuator system; and
    setting the threshold values based on the statistical analysis.

18. A method as in claim 11 further including:
    computing profiles of the system parameters values over at least one type of range selected from the group consisting of position, time and temperature.

19. A method as in claim 18 wherein computing profiles of the system parameters values comprises computing profiles of the system parameters values over a range of actuator motion.

20. A method as in claim 18 wherein the profiles are selected from the group consisting of Total Flight Time, Controller Temperature Profile, Motor Temperature Profile, Average Actuator Position, Position/Time Profile, Distance by Position Profile, Load by Position Profile, Work by Position Profile, Peak Load by Position Profile, Peak Work by Position Profile, Peak Hall State/Potentiometer by Position, Illegal Hall States, and Watchdog Events.

* * * * *